United States Patent [19]

Nunokawa

[11] Patent Number: 5,376,906
[45] Date of Patent: Dec. 27, 1994

[54] CCD FILTER HAVING COMB-SHAPED CHARACTERISTICS

[75] Inventor: Atsuhiko Nunokawa, Yokohama, Japan

[73] Assignee: Kabushiki Kaisha Toshiba, Kawasaki, Japan

[21] Appl. No.: 139,022

[22] Filed: Oct. 21, 1993

[30] Foreign Application Priority Data

Oct. 21, 1992 [JP] Japan .................. 4-283097

[51] Int. Cl.$^5$ .................. H03H 7/30; G11C 19/28
[52] U.S. Cl. ................... 333/165; 257/241
[58] Field of Search ............. 333/165; 257/241, 223; 307/607; 377/63

[56] References Cited

U.S. PATENT DOCUMENTS 4,510,522  4/1985  Pritchard ............... 333/165

FOREIGN PATENT DOCUMENTS

| 0153823 | 11/1981 | Japan | 333/165 |
| 57-6704 | 2/1982 | Japan | |
| 0247316 | 12/1985 | Japan | 333/165 |
| 4-44330 | 2/1992 | Japan | |
| 4-128952 | 4/1992 | Japan | |

*Primary Examiner*—Robert J. Pascal
*Assistant Examiner*—Darius Gambino
*Attorney, Agent, or Firm*—Oblon, Spivak, McClelland, Maier & Neustadt

[57] ABSTRACT

A CCD filter according to the present invention can provide good comb-shaped characteristics with no adjustments, and can be produced at low cost. The input section 15 of a first CCD 11 is constructed so that it can linearly reduce transferred charges when an input voltage increases. The input section 17 of a second CCD 12 is constructed so that it can linearly increase transferred charges when the input voltage increases. The transferred charges of the first and second CCDs 11 and 12 are added to each other by means of charge adder section 13, and the addition result is output from an output section 14.

1 Claim, 6 Drawing Sheets

CCD FILTER HAVING COMB-SHAPED CHARACTERISTICS

BACKGROUND OF THE INVENTION

1. Field of the Invention

This invention relates to a signal processing apparatus for filtering an input signal by performing subtraction of signal charge with the use of a charge-coupled device, and more particularly to a method for obtaining a filter of comb-shaped characteristics with good performance.

2. Description of the Related Art

A filter of comb-shaped characteristics is generally used to, for example, separate a luminance signal (hereinafter referred to as a "Y signal") and a color signal (hereinafter referred to as a "C signal") from a composite image signal.

The Y and C signals are discrete signals, and have energies in relation to frequency as shown in FIG. 1, if they are components of an NTSC composite image signal. To separate the Y and C signals from the NTSC composite signal, a signal processing apparatus as shown in FIG. 2 is generally used.

In FIG. 2, reference numerals 1 and 2 denote multiplier sections for multiplying an input signal by respective predetermined coefficients. These coefficients are determined based on control signals Vh1 and Vh2, respectively. An output from the multiplier section 1 is input to a delaying section (D)3 with a period of delay equal to one horizontal scanning period. An output from the delaying section 3 and an output from the multiplier section 2 are added to each other in an adder section 4, and an addition result is output as an output signal Vout.

When the control signals Vh1 and Vh2 have such values as enable both the coefficients of the multiplier sections 1 and 2 to be 1, the Y signal is output as the output signal Vout. Further, when the control signals Vh1 and Vh2 have such values as enable the coefficients of the multiplier sections 1 and 2 to be 1 and −1, respectively, the adder section 4 performs substantial subtraction, with the result that the C signal is output as the output signal Vout. FIG. 3 shows gain characteristics of the thus-separated Y and C signals.

Where substantial subtraction is performed by means of a charge-coupled device (hereinafter referred to as a "CCD") to obtain the C signal by means of the signal processing apparatus shown in FIG. 2, the CCD has a structure as shown in FIG. 4.

In FIG. 4, reference numeral 11 denotes a first input/transfer section (hereinafter referred to as a "first CCD") which includes the input section of an input signal Vin, the multiplier section 1, and the delaying section 3, reference numeral 12 a second input/transfer section (hereinafter referred to as a "second CCD") which includes the input section of the signal Vin, and part of the multiplier 2, reference numeral 13 an adder section for adding the signal charges of the first and second CCDs 11 and 12, reference numeral 14 an output section for extracting a signal charge, and reference numeral 31 a part of the multiplier 2.

Further, reference numeral 15 denotes the input section of the first CCD 11, reference numeral 16 the transfer section of the first CCD 11, reference numeral 17 the input section of the second CCD 12, reference numeral 18 the transfer section of the second CCD 12, reference numeral 21 a measuring electrode provided in the first CCD 11 for measuring the charge of a signal, reference numeral 23 a measuring electrode provided in the second CCD 12 for measuring the charge of a signal, and reference numerals 22 and 24 input voltage applying electrodes for applying input signals.

The transfer section 18 of the second CCD 12 has $a$ stages of transfer electrodes ($a$: a positive integer) controlled by two-phase clock signals $\phi 1$ and $\phi 2$. The transfer section 16 of the first CCD 11 has $\beta$ stages of transfer electrodes ($\beta$: a positive integer), which are controlled by two-phase clock signals $\phi 1$ and $\phi 2$ to obtain a period of delay equal to one horizontal scanning period, plus $a$ stages of transfer electrodes. The first and second CCDs 11 and 12, the adder section 13 and the output section 14 are separated by thick field insulating films formed on a semiconductor substrate, and are respectively located in diffusion regions called transfer channels.

As is shown in FIG. 4, to perform subtraction by the use of the CCD, the input coefficient of one of the first and second input sections 15 and 17 must be −1. FIG. 4 shows an example in which the input signal Vin is input to the second input section 17 after it is inverted by means of an inverting circuit 31.

The inverting circuit 31 may be provided outside an IC as shown in FIG. 5, or inside the same as shown in FIG. 6.

In the case of FIG. 5, it is necessary to construct the inverting circuit 31 by means of an external component, and also to employ an input terminal 32 for receiving an inverted signal. In the case of FIG. 6, the inverting circuit 31 generally consists of a MOS transistor which can be easily formed on a substrate, together with CCD elements. FIG. 7 shows an example of a MOS transistor inverting circuit.

In both the cases of FIGS. 5 and 6, however, it is difficult in view of variations in process to construct the inverting circuit 31 such that it always has a gain of 0 dB. Accordingly, a gain difference occurs between the input signals of the first and second input sections 15 and 17, thus providing shallow comb-shaped characteristics. As a result, good separation of the Y and C signals is hard to perform.

The conventional signal processing apparatus has further drawbacks as follows:

i) Where an input signal is supplied to two terminals, and only a signal supplied to an inverting terminal (i.e. the inverting circuit 31) of the two terminals is inverted, there occurs a gain difference between the inverted signal and a non-inverted signal. If these signals are added to each other, good comb-shaped characteristics cannot be obtained.

ii) Where a voltage is supplied to the CCD charge measuring electrode from the outside so as to eliminate the gain difference, a particular voltage input terminal 33 is necessary, and a further cost is required to perform voltage adjustment.

iii) Where the inverting circuit is provided outside the IC, it is necessary to employ the inverting-signal inputting terminal 32, which increases the cost required to construct the outside inverting circuit.

SUMMARY OF THE INVENTION

As described above, the conventional filter of comb-shaped characteristics is disadvantageous in that it cannot provide good comb-shaped characteristics due to variations between inverting circuit elements, costs much since voltage adjustment is needed, and requires a cost for constructing the outside inverting circuit.

The present invention has been developed to overcome the above drawbacks, and its object is to provide a CCD-type filter of low cost, capable of providing good comb-shaped characteristics without adjustment.

According to a first aspect of the invention, there is provided a CCD filter of comb-shaped characteristics comprising: first delay means consisting of a charge-coupled device, having an input section for converting an input voltage into a transferred charge, and disposed to linearly reduce the amount of the transferred charge when the input voltage increases; second delay means consisting of a charge-coupled device, having an input section for converting an input voltage into a transferred charge, and disposed to linearly increase the amount of the transferred charge when the input voltage increases; combining means for combining the transferred charge of the first delay means with the transferred charge of the second delay means; and detection means for detecting the combined charge output from the combining means.

The input section of the first delay means includes a first input voltage applying electrode, a first charge measuring electrode located rearward of the first input voltage applying electrode, and a first power source for applying a first control voltage to the first charge measuring electrode; the input section of the second delay means includes a second input voltage applying electrode, a second charge measuring electrode located forward of the second input voltage applying electrode, and a second power source for applying a second control voltage to the second charge measuring electrode; the first and second input applying electrodes are connected to an input terminal; and the ratio of the first control voltage to the second control voltage is constant.

Preferably, the ratio between the first control voltage, the second control voltage, and an input bias voltage supplied to the first and second input voltage applying electrodes is constant.

More preferably, the source of the input section of the first delay means is connected to the source of the input section of the second delay means.

The present invention is directed to an improvement of subtraction means employed in a case where a filter of comb-shaped characteristics consists of a charge-coupled device (CCD). According to the above-described structure, the first input section is disposed to decrease the transferred charge as the input voltage increases, while the second input section is disposed to increase the transferred charge as the input voltage increases. Further, the same input signal is supplied to the first and second input voltage applying electrodes, and the amount of delay of the first delay means differs from that of the second delay means. Thus, the transfer bits of the first and second delay means are changed to thereby join the transferred portions of charges, thus adding them to each other. As a result, subtraction is performed virtually. The added or combined transferred charges are detected so as to obtain good comb-shaped characteristics. As a result, a CCD filter of good comb-shaped characteristics can be provided at low cost and with no adjustments.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a Dart of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The embodiments of the invention will be explained in detail with reference to the accompanying drawings.

Figure 1:
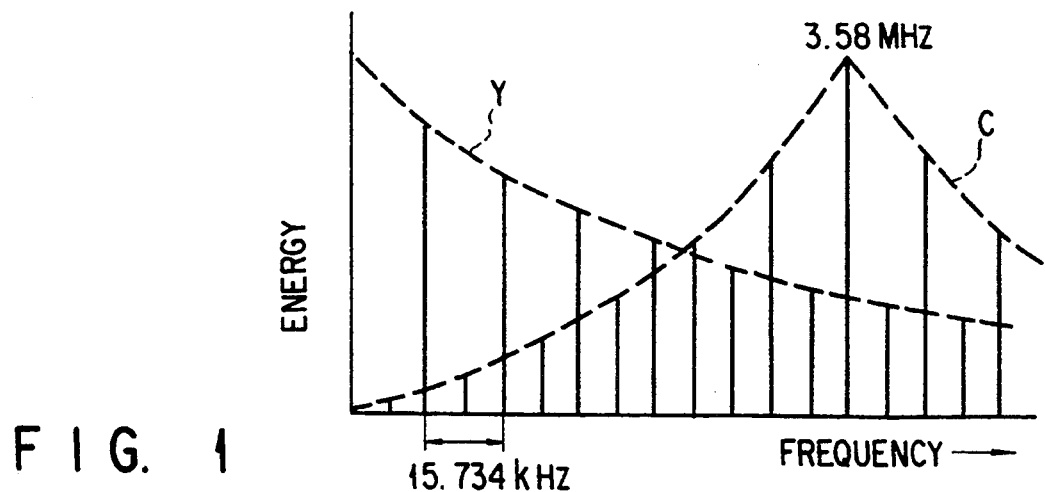
FIG. 1 is a graph, showing the relationship between the energy and frequency of an NTSC composite image signal.
Figure 2:
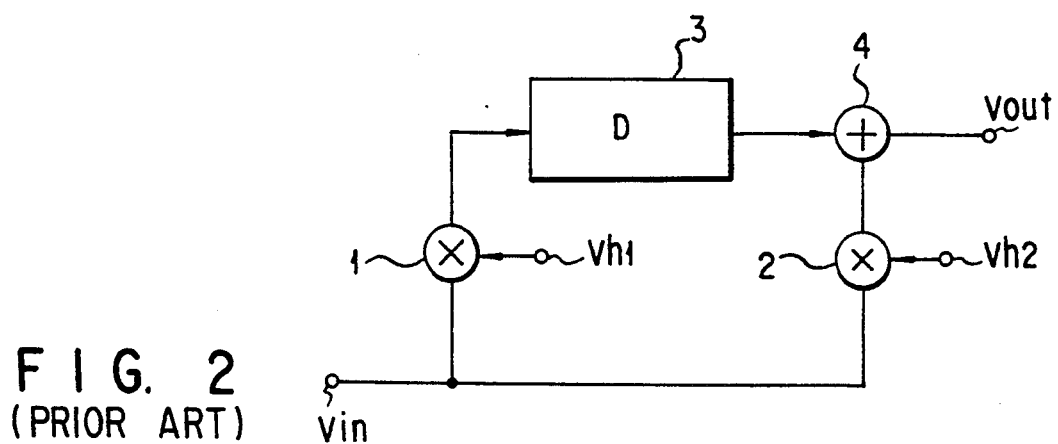
FIG. 2 is a circuit diagram, showing an example of a conventional signal processing apparatus whose output signal has comb-shaped characteristics.
Figure 3:
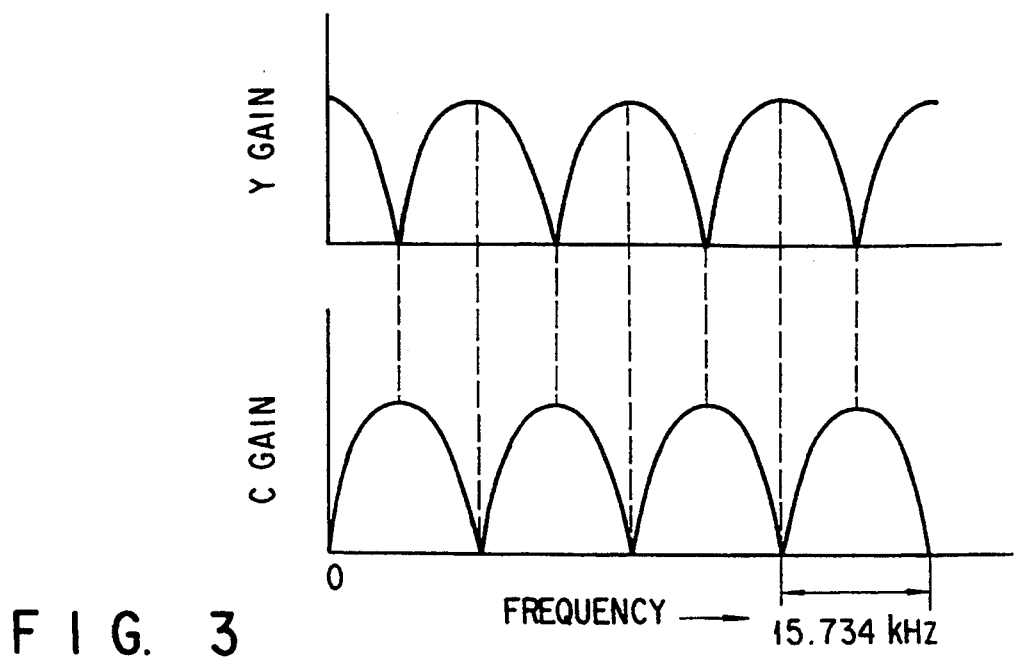
FIG. 3 is a graph, showing the gain characteristics of a Y signal and a C signal which are separated by means of an NTSC filter of comb-shaped characteristics.
Figure 4:
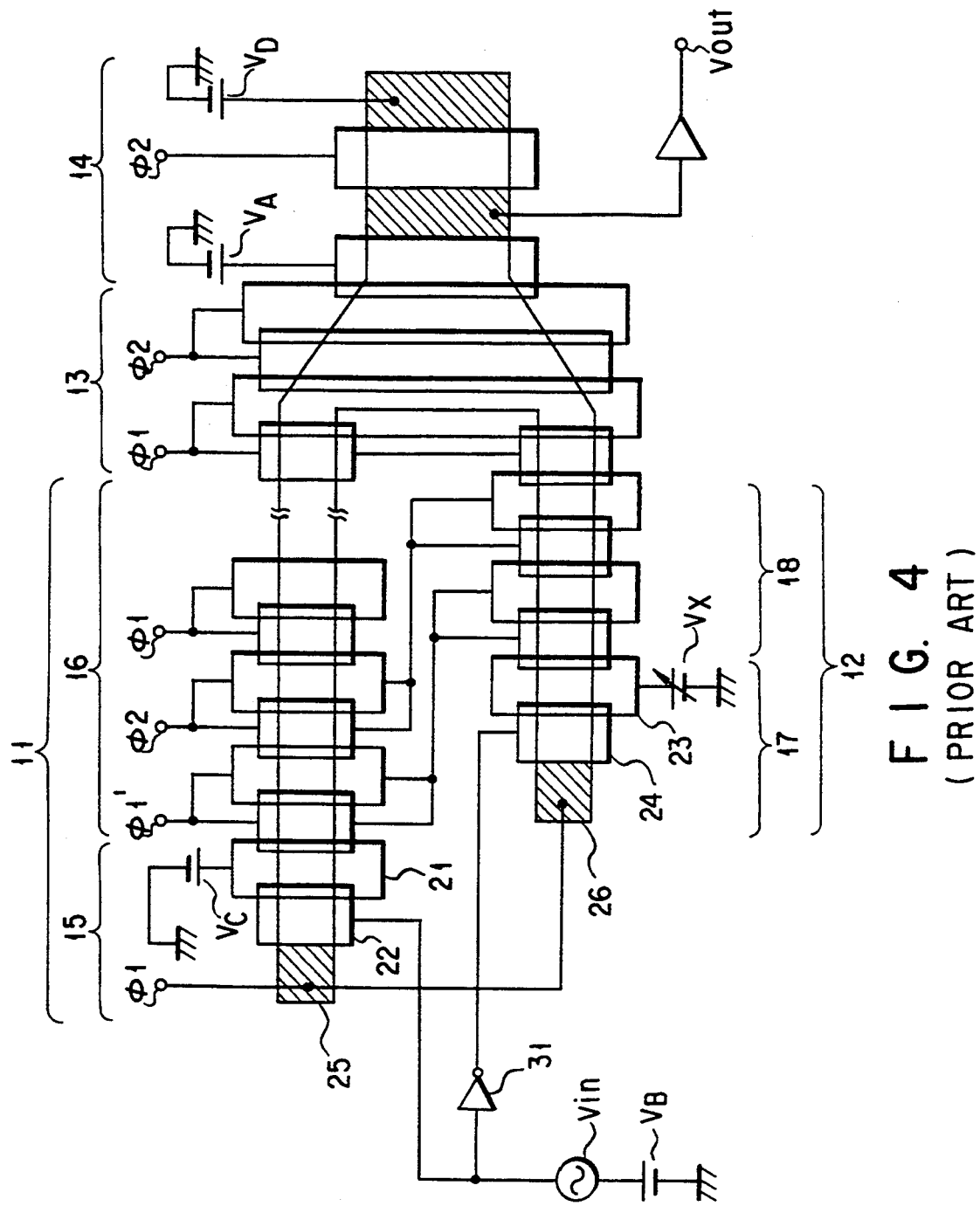
FIG. 4 is a plan view, showing a conventional CCD filter of comb-shaped characteristics.
Figure 5:
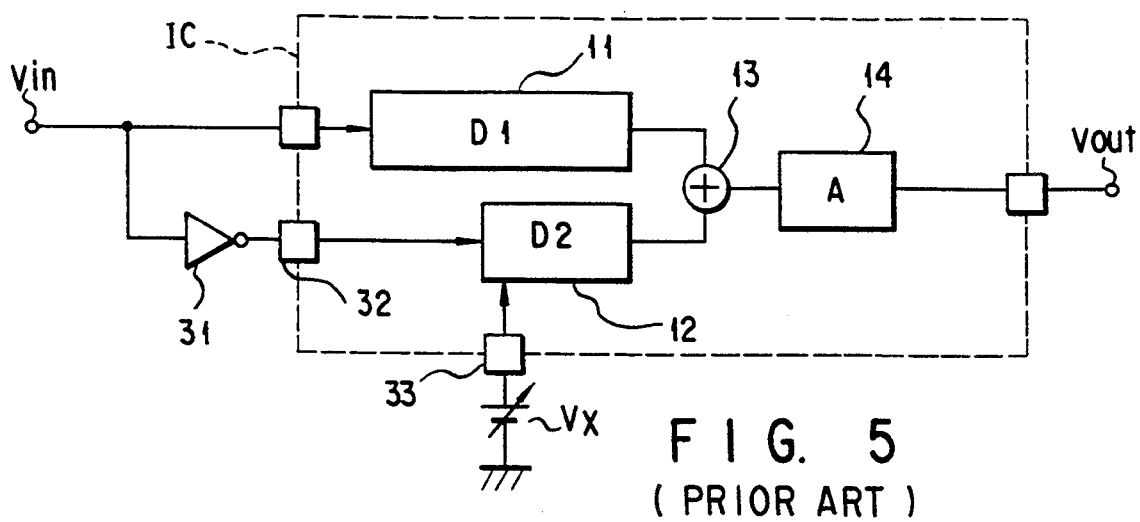
FIG. 5 is a circuit diagram, showing a conventional filter of comb-shaped characteristics which has an inverting circuit provided outside an IC.
Figure 6:
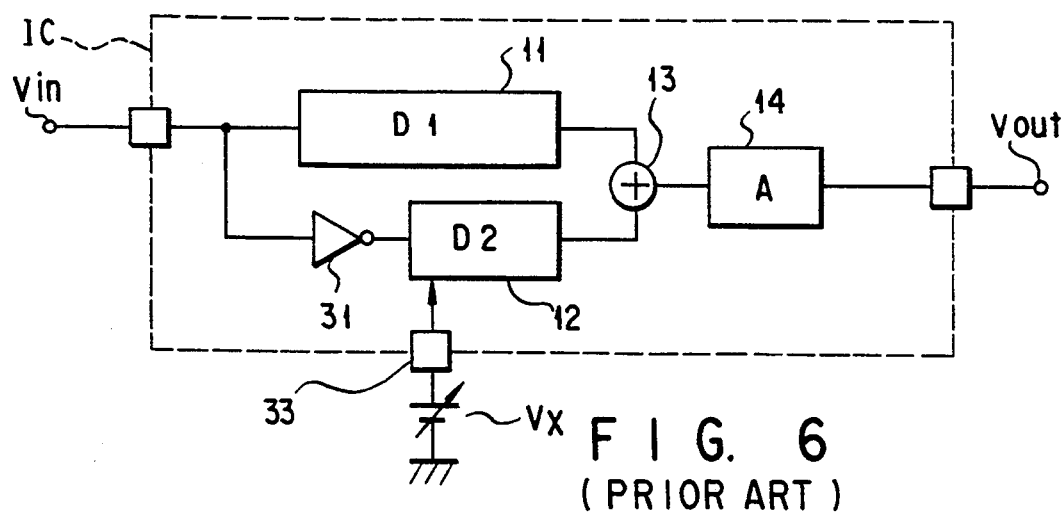
FIG. 6 is a circuit diagram, showing a conventional filter of comb-shaped characteristics which has an inverting circuit provided inside an IC.
Figure 7:
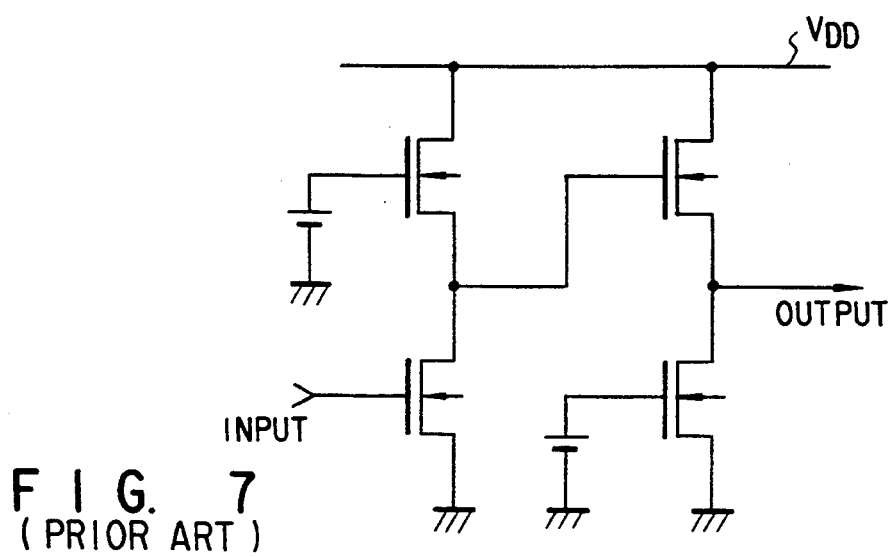
FIG. 7 is a circuit diagram, showing an example of a conventional inverting circuit provided inside an IC.
Figure 8:
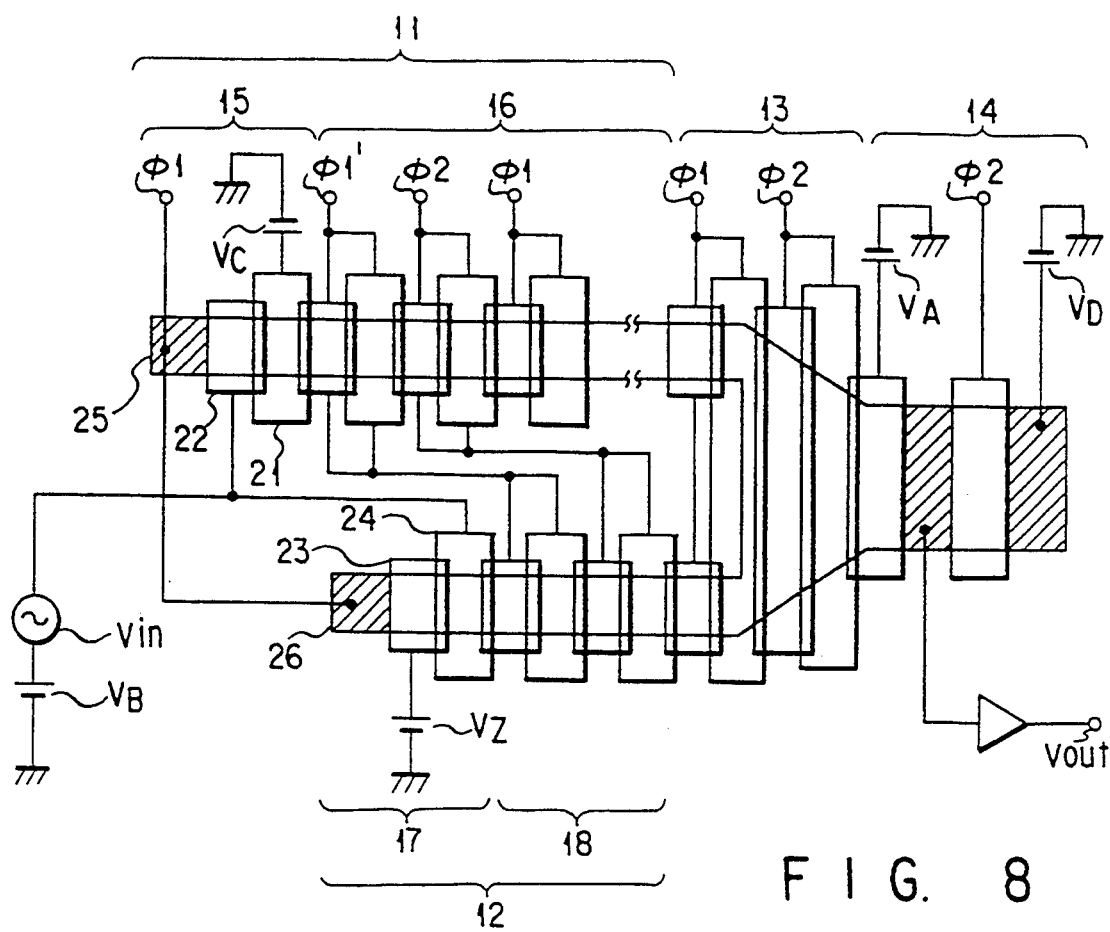
FIG. 8 is a plan view, showing a CCD filter of comb-shaped characteristics according to an embodiment of the invention.

FIG. 8 shows a CCD filter of comb-shaped characteristics according to an embodiment of the invention. This CCD filter has a similar structure to the conventional one shown in FIG. 4 except for the input section of the second CCD and the inverting circuit.

Figure 9:
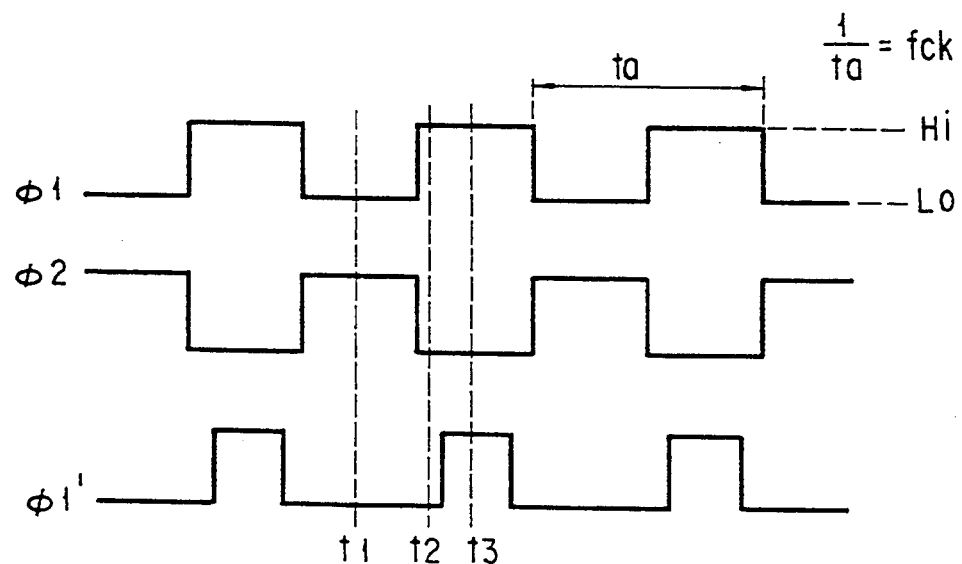
FIG. 9 is a view, showing the waveforms of clock signals $\Phi 1$, $\Phi 2$, and $\Phi 1'$ used in the filter of FIG. 8.

In the first CCD input section 15, the charge measuring electrode 21 is located rearward of the input signal applying electrode 22, and is supplied with a voltage Vc. In the second CCD input section 17, the charge measuring electrode 23 is located forward of the input signal apply electrode 24, and is supplied with a voltage Vz. The first and second input signal applying electrodes 22 and 24 are connected to each other for applying an input signal Vin biased by a voltage $V_B$. Transfer gates are supplied with transfer pulses $\phi 1$, $\phi 2$, and $\phi 1'$ generated as shown in FIG. 9.

Figure 10:
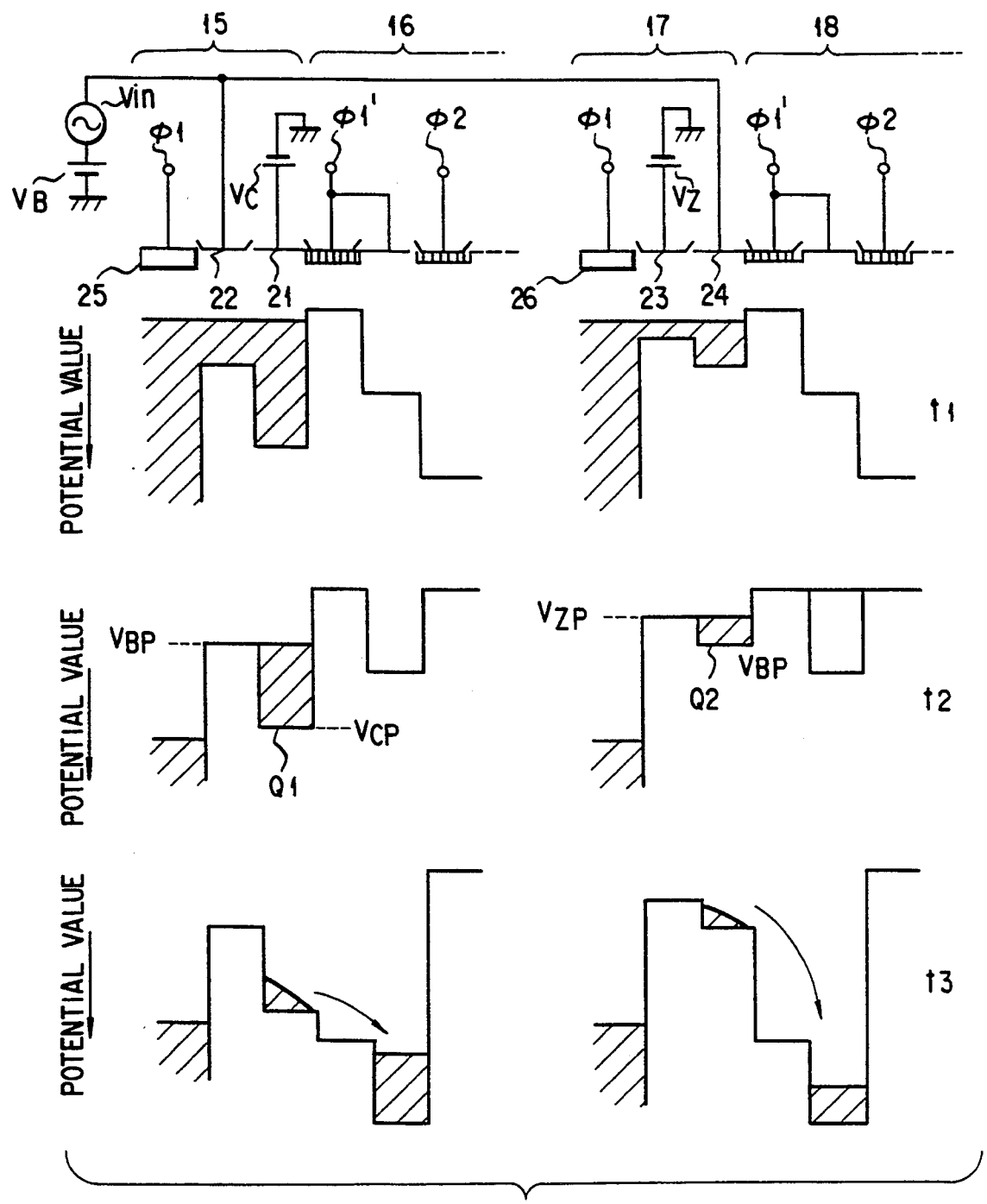
FIG. 10 is a view, explaining the input mechanism of charge in the input sections of the filter of FIG. 8

The input operation will be explained with reference to FIG. 10 which shows the potentials of the input sections of the first and second.

At a time point $t_1$, the pulse $\phi 1$ supplied to the source diffusion regions 25 and 26 of the first and second CCD input sections 15 and 17 is at Lo level, thereby fully charging the CCD input sections 15 and 17.

Then, at a time point $t_2$, the $\phi 1$ becomes Hi level, and hence a charge Q1 proportional to the difference between the potential $V_{BP}$ of the input signal voltage $V_B$ and the potential $V_{CP}$ of the voltage $V_C$ supplied to the charge measuring electrode 21 of the first CCD input section 15 remains under the charge measuring electrode 21. Further, a charge Q2 proportional to the difference between the potential $V_{ZP}$ of the voltage $V_Z$ supplied to the charge measuring electrode 23 and the potential $V_{BP}$ of the input signal voltage $V_B$ remains under the input signal applying electrode 24 of the second CCD input section 17.

The above relationship is expressed by the following formulas (1) and (2):

$$V_{CP} - V_{BP} \alpha Q1 \qquad (1)$$

$$V_{BP} - V_{ZP} \alpha Q2 \qquad (2)$$

where $\alpha$ represents proportion.

The voltages $V_C$ and $V_Z$ are constant values, and their potentials $V_{CP}$ and $V_{ZP}$ are constant values. As is evident from the formula (1), in the first CCD input section 15, the input charge Q1 decreases as the input voltage $V_B$ increases, and increases as the input voltage $V_B$ decreases.

Figure 11:
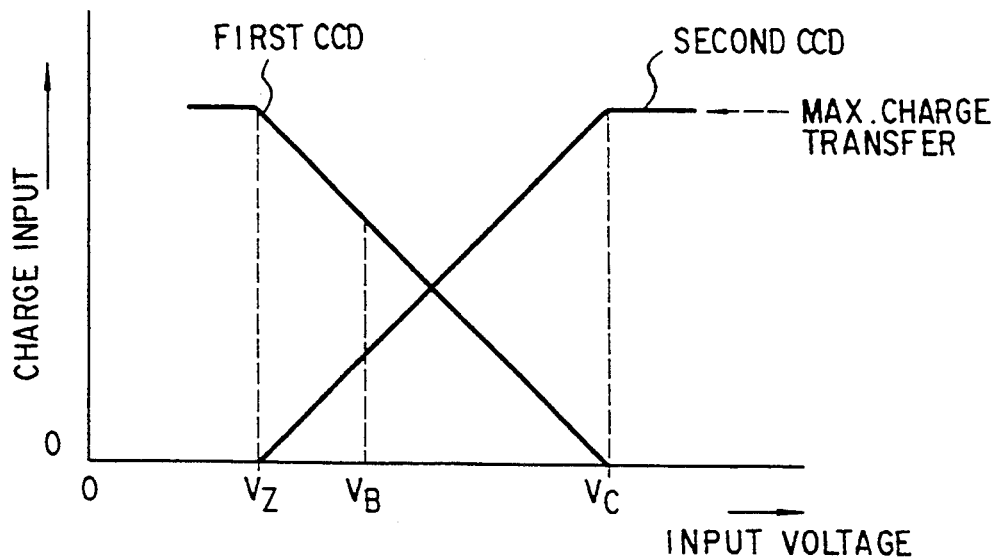
FIG. 11 is a view, showing the relationship between an input voltage and an input charge in the filter of FIG. 8.

Similarly, as is evident from the formula (2), in the second CCD input section 17, the input charge Q2 increases as the input voltage $V_B$ increases, and decreases as the input voltage $V_B$ decreases. The relationship between the input voltage and the input charge is shown in FIG. 11.

At a time point $t_3$, the input charges Q1 and Q2 are transferred to the first and second CCD transfer sections 16 and 18, respectively. The first CCD transfer section 16 performs transfer of $(\beta + \alpha)$ stages, and the second CCD transfer section 18 performs transfer of $\alpha$ stages. The outputs of the transfer sections 16 and 18 are added in the charge adder section 13, and the adding result is output as the output signal $V_{OUT}$ from the charge detecting section 14.

In the case of separating an NTSC composite image signal, for example, the C signal can be obtained as the output signal $V_{OUT}$ by setting the driving pulse frequency fck shown in FIG. 9 to 14.31818 MHz and setting the $\alpha$ to 1 and the $(\alpha + \beta)$ to 911. As described above, in the present invention, the first CCD input section 15 is constructed such that the input charge linearly decreases as the input voltage increases, while the second CCD input section 17 is constructed such that the input charge linearly increases as the input voltage increases. Thus, in the overall CCD input section, inverting processing (using a multiplier coefficient of $-1$) is performed, thereby dispensing with the inverting circuit 31.

Therefore, the apparatus of the invention is free from a gain difference between input signals due to variation in the inverting circuit 31, which makes unnecessary gain adjustment using an external voltage. Thus, good separation of the Y signal and the C signal can be performed at low cost with no adjustments. Although the Fill & Spill input system is employed in the above embodiment, another input system may be employed.

Figure 12:
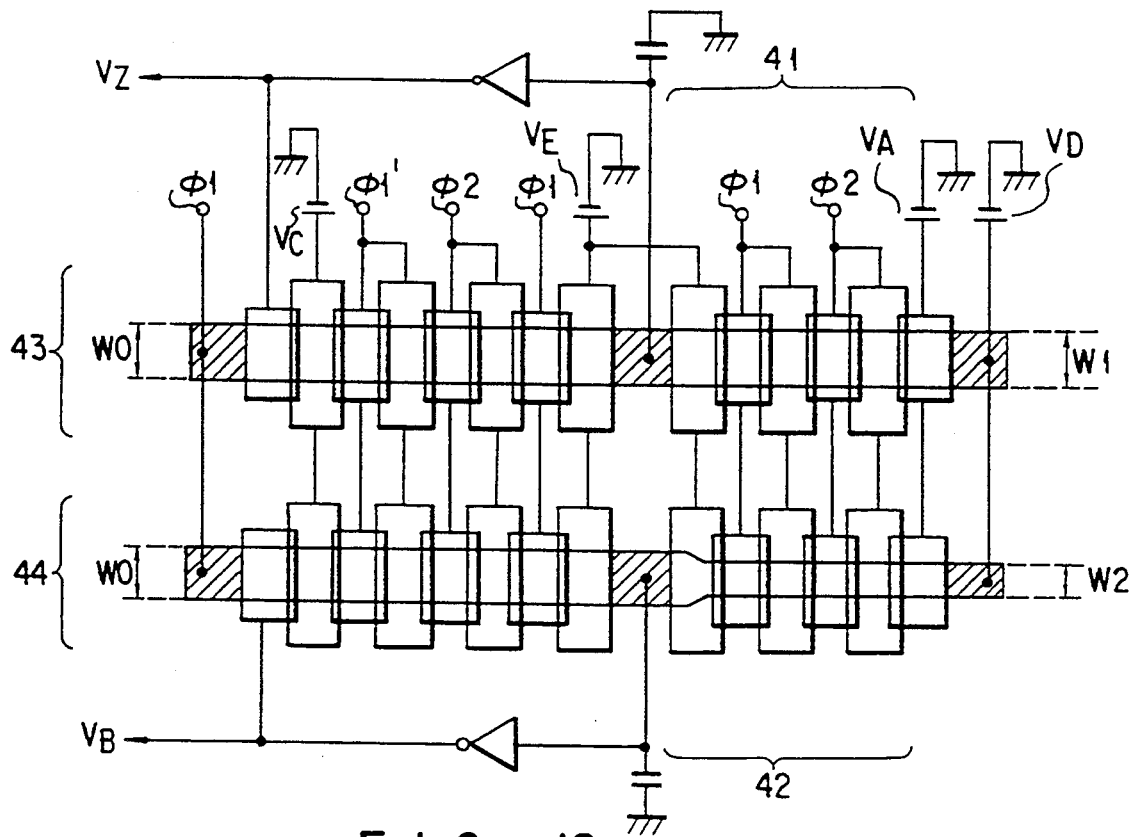
FIG. 12 is a plan view, showing a CCD filter of comb-shaped characteristics according to another embodiment of the invention.

The voltages $V_B$, $V_C$, and $V_Z$ necessary in the input sections are generated by the following method:

FIG. 12 shows a system for generating, with the use of a CCD register other than the signal transfer CCD, an input bias voltage used to input a desired percentage of a CCD maximum transferred charge.

The operation of this system is disclosed in, for example, the description of prior art in the specification of another application (Jpn. Pat. Appln. KOKAI Publication No. 4-44330) filed by the same inventor as the present application. Therefore, no explanations will be given of the operation.

The charge transfer amount of rear portions 41 and 42 of registers in FIG. 12 can be set to a value at which the input bias voltage enables to input a desired percentage of the maximum transferred charge, by changing the widths W1 W2 of the CCD transfer regions to a maximum width W0. In the case of FIG. 12, the voltage $V_C$ is used as a reference voltage. By setting W0=W1, the register 43 is disposed to generate an input voltage $V_Z$ corresponding to 100% of the maximum transferred charge. On the other hand, by setting W2/W0 to a value falling between 0-100%, the second register generates an input bias voltage $V_B$ (see FIG. 11).

Since the voltages which always satisfy $V_C > V_B > V_Z$ and $V_C - V_Z$: $V_C - V_B = W1:W2$, are used in the apparatus shown in FIG. 8, a stable output signal can be obtained at all times, irrespective of variation in the CCD potential profile. It is a matter of course that these voltages may be generated by means of another system (which employs, for example, a simple resistive divider), only if they satisfy $V_C > V_B > V_Z$.

In summary, the CCD filter of comb-shaped characteristics according to the present invention has the following advantages:

i) Since the filter of the present invention employs a CCD input section for inverting an input signal, an inverting circuit which is employed in the conventional apparatus is not necessary. As a result, the filter is free from gain variations, and therefore has good comb-shaped characteristics.

ii) Since no inverting circuits are necessary and hence no gain variations occur, gain adjustment using an external voltage is not necessary. As a result, iii) Also in the case of constructing an inverting circuit outside the IC, this inverting circuit can be dispensed with, and accordingly an inverting signal input terminal and an external component can be dispensed with, reducing the manufacturing cost.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A CCD filter of comb-shaped characteristics comprising:

first delay means including a charge-coupled device, having an input section for converting an input voltage into a transferred charge, and disposed to linearly decrease the amount of the transferred charge when the input voltage increases, the input section of the first delay means including a first input voltage applying electrode connected to an input terminal, a first charge measuring electrode located rearward of the first input voltage applying electrode, and a first power source for applying a first control voltage to the first charge measuring electrode;

second delay means including a charge-coupled device, having an input section for converting an input voltage into a transferred charge, and disposed to linearly increase the amount of the transferred charge when the input voltage increases; the input section of the second delay means including a second input voltage applying electrode connected to said input terminal, a second charge measuring electrode located forward of the second input voltage applying electrode, and a second power source for applying a second control voltage to the second charge measuring electrode, a ratio of the second control voltage to the first control voltage being constant;

combining means for combining the transferred charge of the first delay means with the transferred charge of the second delay means; and detection means for detecting the combined charge output from the combining means.

* * * * *